(12) United States Patent
Ausserlechner et al.

(10) Patent No.: US 8,896,303 B2
(45) Date of Patent: Nov. 25, 2014

(54) LOW OFFSET VERTICAL HALL DEVICE AND CURRENT SPINNING METHOD

(75) Inventors: Udo Ausserlechner, Villach (AT); Mario Motz, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 173 days.

(21) Appl. No.: 13/488,709

(22) Filed: Jun. 27, 2012

(65) Prior Publication Data

US 2012/0286776 A1 Nov. 15, 2012

Related U.S. Application Data

(63) Continuation-in-part of application No. 13/022,844, filed on Feb. 8, 2011.

(51) Int. Cl.
G01R 33/07 (2006.01)
H01L 43/10 (2006.01)
H01L 27/22 (2006.01)

(52) U.S. Cl.
CPC .............. *G01R 33/07* (2013.01); *H01L 27/22* (2013.01); *G01R 33/075* (2013.01); *G01R 33/077* (2013.01)
USPC .......................................... 324/251; 257/425

(58) Field of Classification Search
USPC ........................................................ 324/251
See application file for complete search history.

(56) References Cited

U.S. PATENT DOCUMENTS

| 3,478,203 A | 11/1969 | Brown |
| 4,829,352 A | 5/1989 | Popovic et al. |
| 4,929,993 A | 5/1990 | Popovic |
| 6,278,271 B1 | 8/2001 | Schott |
| 7,339,245 B2 | 3/2008 | Mueller |
| 2005/0230770 A1 | 10/2005 | Oohira |
| 2006/0097715 A1 | 5/2006 | Oohira et al. |
| 2007/0290682 A1 | 12/2007 | Oohira et al. |

FOREIGN PATENT DOCUMENTS

| CN | 101290946 A | 10/2008 |
| CN | 101770981 A | 7/2010 |
| DE | 10240404 A1 | 3/2004 |
| EP | 0947846 A2 | 10/1999 |
| FR | 2844882 A1 | 3/2004 |
| WO | 2006028426 A1 | 3/2006 |

OTHER PUBLICATIONS

Final Office Action dated Feb. 21, 2014 U.S. Appl. No. 13/022,844.
Popovic, R.S., "Hall Effect Devices: Magnetic Sensors and Characterization of Semiconductors." 6 Pages.
U.S. Appl. No. 13/022,844, filed Feb. 8, 2011.
Non-Final Office Action dated Sep. 11, 2013 for U.S. Appl. No. 13/022,844. 19 Pages.
Notice of Allowance Dated May 14, 2014 U.S. Appl. No. 13/022,844.

*Primary Examiner* — Bot Ledynh
(74) *Attorney, Agent, or Firm* — Eschweiler & Associates, LLC

(57) ABSTRACT

One embodiment of the present invention relates to a vertical Hall-effect device. The device includes at least two supply terminals arranged to supply electrical energy to the first Hall-effect region; and at least one Hall signal terminal arranged to provide a first Hall signal from the first Hall-effect region. The first Hall signal is indicative of a magnetic field which is parallel to the surface of the semiconductor substrate and which acts on the first Hall-effect region. One or more of the at least two supply terminals or one or more of the at least one Hall signal terminal comprises a force contact and a sense contact.

9 Claims, 16 Drawing Sheets

CLOCK CYCLE 1

CLOCK CYCLE 2

CLOCK CYCLE 3

CLOCK CYCLE 4

1200

1200

US 8,896,303 B2

LOW OFFSET VERTICAL HALL DEVICE AND CURRENT SPINNING METHOD

REFERENCE TO RELATED APPLICATION

This application is a continuation in part application of U.S. application Ser. No. 13/022,844 filed on Feb. 8, 2011. The contents of this related application are hereby incorporated by reference in their entirety.

BACKGROUND

Hall-effect devices are often used in sensor applications for contactless sensing of magnetic fields. FIG. 1 shows a conventional Hall plate 100. The Hall plate 100 is operated by providing a predetermined current 104 along a first axis 106 between first and second supply terminals $S_1$, $S_2$. According to the Hall principle (and Lorentz's right hand rule as shown by 108), the presence of a magnetic field B causes positively charged particles (e.g., holes 110) which are traveling with velocity v during flow of current 104, to be "steered" or deflected in the F direction along second axis 112, thereby inducing a voltage differential between Hall effect terminals $H_1$ and $H_2$. The amount of "steering" or deflection of these charged particles depends on the magnitude of the magnetic field B, such that the magnitude of voltage differential between $H_1$ and $H_2$ is proportional to the magnitude of magnetic field B. Hence, in the presence of predetermined current 104, measuring the voltage across Hall effect terminals $H_1$ and $H_2$ provides an accurate measurement of the magnetic field B.

As will be appreciated in greater detail below, the present disclosure relates to improved Hall-effect measurement techniques.

DETAILED DESCRIPTION

Figure 1:
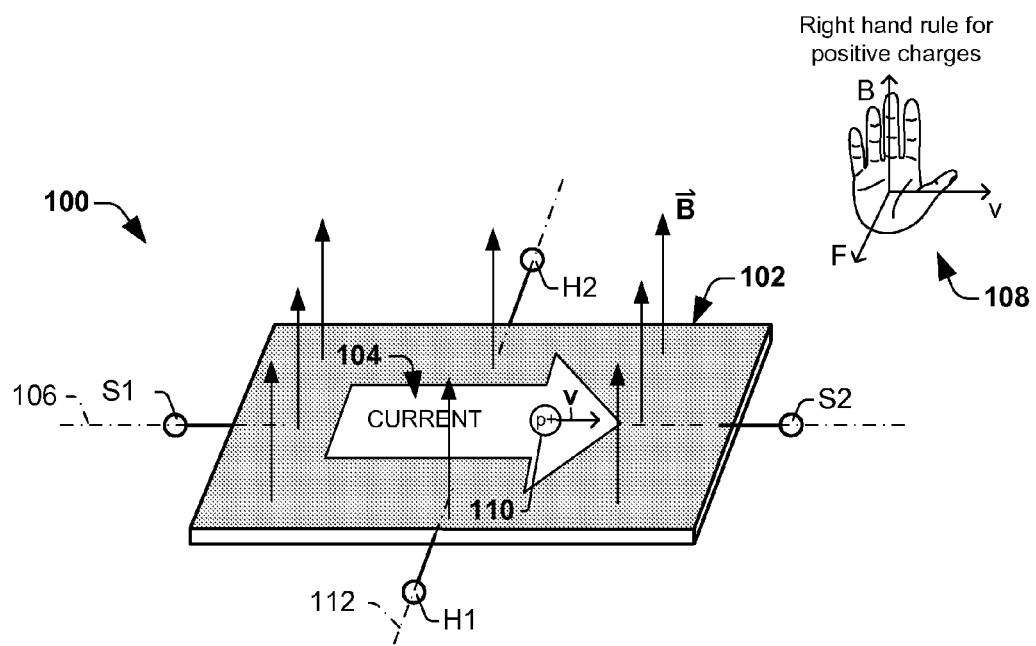
FIG. 1 illustrates an operating principle of a conventional Hall plate.

The present invention will now be described with reference to the attached drawing figures, wherein like reference numerals are used to refer to like elements throughout, and wherein the illustrated structures and devices are not necessarily drawn to scale.

Figure 2:
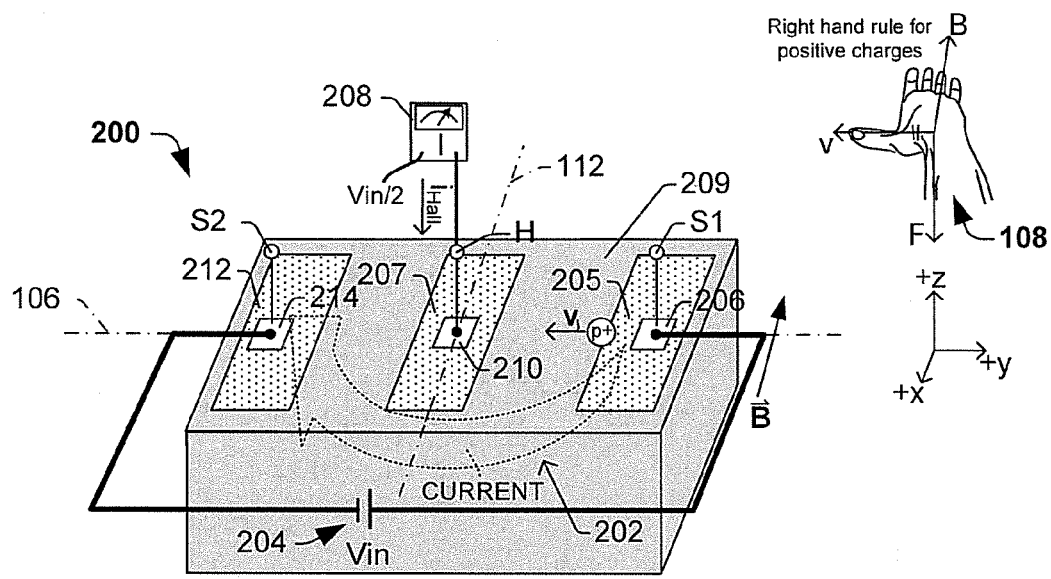
FIGS. 2-3 illustrate a vertical Hall-effect device that suffers from some shortcomings.
Figure 3:
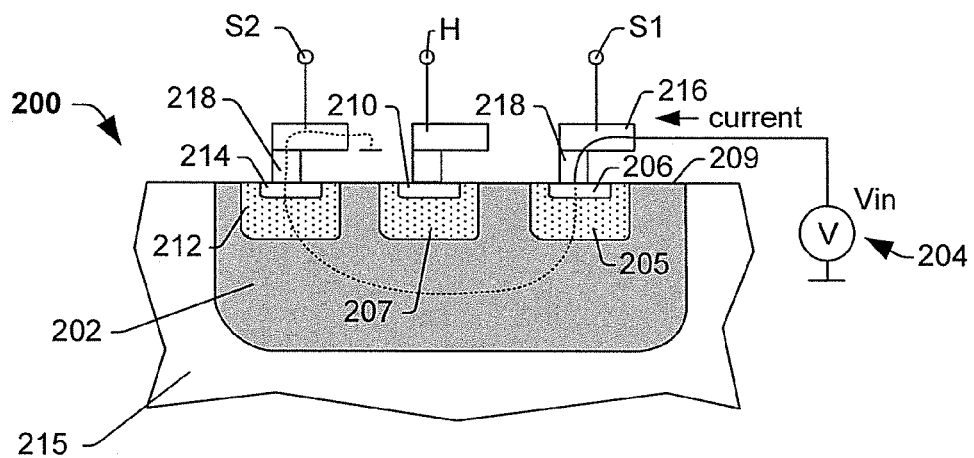

In contrast to FIG. 1, which explained the Hall-effect in the context of a relatively flat Hall plate, the present disclosure deals with accurate measurement techniques for vertical Hall-effect devices. FIGS. 2 and 3 show a perspective view and a cross-sectional view, respectively, for a vertical Hall-effect device 200 that suffers from some shortcomings. Vertical Hall-effect device 200 includes a hall sensing region 202 (e.g., lightly doped n-region), which is coupled to supply contacts S1, S2 and Hall signal contact H.

The vertical Hall-effect device 200 is operated in a "voltage input—current output" mode. To this end, a voltage source 204 applies an input voltage Vin across the supply contacts S1, S2. For example, supply contact S1 can be held at Vin while supply contact S2 can be held at ground. In accordance with Ohm's law (V=IR), this input voltage Vin induces a corresponding current flow between supply contacts S1, S2.

Assuming the Hall signal contact H is centered between the supply contacts S1, S2 and assuming that there is a uniform resistance over the Hall region 202, then the Hall signal contact H will experience a voltage of Vin/2 at zero magnetic field. Hence, if Hall signal contact H was held at Vin/2 in the presence of zero magnetic field, this would constitute an equilibrium condition and no current would flow into the Hall signal contact H.

In the presence of a non-zero magnetic field B, however, the case is slightly different. Now charged carriers in the flow of current are "steered" or deflected according to the right hand rule 108 in an attempt to raise or lower the potential on the Hall signal contact H. For example, consider the illustrated case where B-field is directed in the negative x-direction and positively charged holes flow in the negative y-direction, such that the holes experience a Hall force that drives the holes downward from substrate surface 209 in an attempt to lower potential on Hall signal contact H. If the Hall signal contact H is still clamped to Vin/2, the charges "steered" by the Hall-effect are unable to raise or lower the potential at the Hall signal contact H. Therefore, a Hall current $I_{Hall}$ will be injected into or sunk from the Hall signal contact H to maintain equilibrium, wherein amount of Hall current injected or sunk is proportional to the magnitude of the magnetic field B. Thus, the Hall current $I_{Hall}$ on Hall signal contact H is indicative of the magnitude of the magnetic field B.

Referring to FIG. 3, one can see a cross-section of the vertical Hall-effect sensor 200 taken along axis 106. First supply contact S1 is implemented as a first well region 205 (e.g., n-well doped n) with one or more contacts 206 (e.g., shallow doped source/drain n+). Hall signal contact H is implemented as a second well region 207 (e.g., n-well doped n) with one or more respective contacts 210 (e.g., shallow doped source/drain n+). Second supply contact S2 is implemented as a third well region 212 (e.g., n-well doped n) with one or more contacts 214 (e.g., doped n+). An isolation structure 215 surrounds Hall region 202.

Ignoring the Hall signal contact H for the moment, let's briefly consider the case where voltage Vin is applied to first supply contact S1, and ground potential (0V) is applied to second supply contact S2. The voltage Vin is applied to a metal 1 wire 216, so current flows over this wire, traverses contact plugs 218, flows into highly doped source-drain diffusion region 206 (n+), spreads out in n-well 205 (n, which is more lightly doped than n+ source/drain regions but more highly doped than n-Hall region 202), until it finally enters the n-Hall region 202. The same sequence in reverse order happens at for the second supply contact S2.

Unfortunately, the contact resistances of the metal 1 wire 216, the contact plugs 218, the n+ source/drain 206 and nwell 205 cause a voltage drop, such that the potential Vin does not actually reach the Hall-region 202. Although these contact resistances are low, they may still cause a voltage drop of a few millivolts which can be significant given the fact that Hall-region 202 typically has a small resistance. Further, in the presence of a zero magnetic field, asymmetries in the geometry of the Hall device can lead to non-zero Hall-effect signals—so called raw offsets. Current spinning schemes combine signals of several spinning cycles, such that this total (combined) signal tends to have a much smaller raw offset than the individual current signals. This combined raw offset can be referred to as a residual offset.

Figure 4:
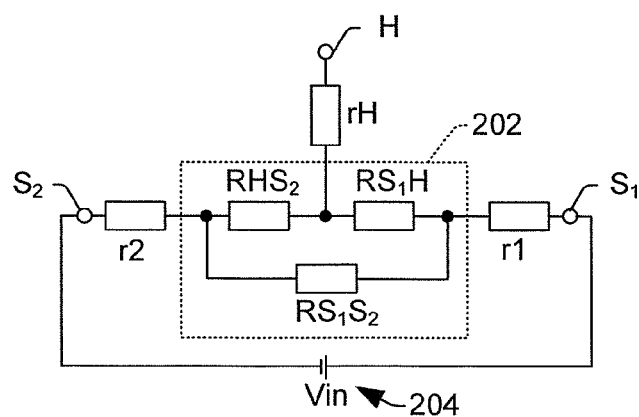
FIG. 4 illustrates an equivalent circuit of FIGS. 2-3, including contact resistances which lead to offset errors.

The reason for this residual offset can be appreciated from FIG. 4, which shows an equivalent circuit diagram including the "true" Hall device 202 (that is the part of the Hall device which is made only of n-Hall region, where the Hall-effect predominantly develops), plus additional contact resistances (r1, r2, rH). Because these contact resistances are not precisely known (and can vary somewhat over the manufacturing process and show mismatch even within one device), these contact resistances cause inaccuracies in the applied voltage potential. For example, consider a hypothetical case where a voltage bias of 5V is applied between S1 and S2, and where the contact resistances r1 and r2 are unknown to the user, but are each actually 10% of the resistance of the Hall region 202, for example. In such a situation, an user might expect that the full 5V bias is applied to the Hall region, but in fact, only 0.8*5V=4V (i.e., 80% of the full bias) is applied over the Hall region, due to a 0.5V voltage drop over each contact resistance (r1, r2). Thus, the potential at the positive supply S1 of the Hall region 202 is 4.5V (instead of 5V) and at the negative supply S2 of the Hall region 202 is 0.5V (instead of 0V).

These inaccurate potentials lead to residual offset errors for spinning current techniques, particularly if the device has an electrical nonlinearity, such as when the resistance level of the resistors r1 and r2 depends on the potential applied. For example, in the real world, the resistance value of r1 is ever-so-slightly larger if 5V is applied S1 and is ever-so-slightly smaller if 4.5V is applied to S1. In the same way, the resistance value of r2 is smaller when 0V is applied to S2, compared to when 0.5V is applied to S2. This leads to the residual offset.

Therefore, it is desirable to apply well defined potentials to the resistors to avoid these residual offset errors. Unfortunately, however, the resistors in FIGS. 2-4 are not directly accessible because of the small contact resistances for each contact. To circumvent the unknown voltage drop along these contact resistances, the invention splits each contact (e.g., supply contacts S1, S2 and Hall signal contact H from FIGS. 2-3) into two parts—a force contact (F) used to carry current and a sense contact (S) used to measure a voltage potential that develops at the 'true' Hall device in the active Hall region. These force-sense contacts achieve well defined potentials at all resistors of the equivalent circuit diagram in all operating phases of the spinning current scheme, thereby limiting or avoiding residual offset errors.

Figure 6:
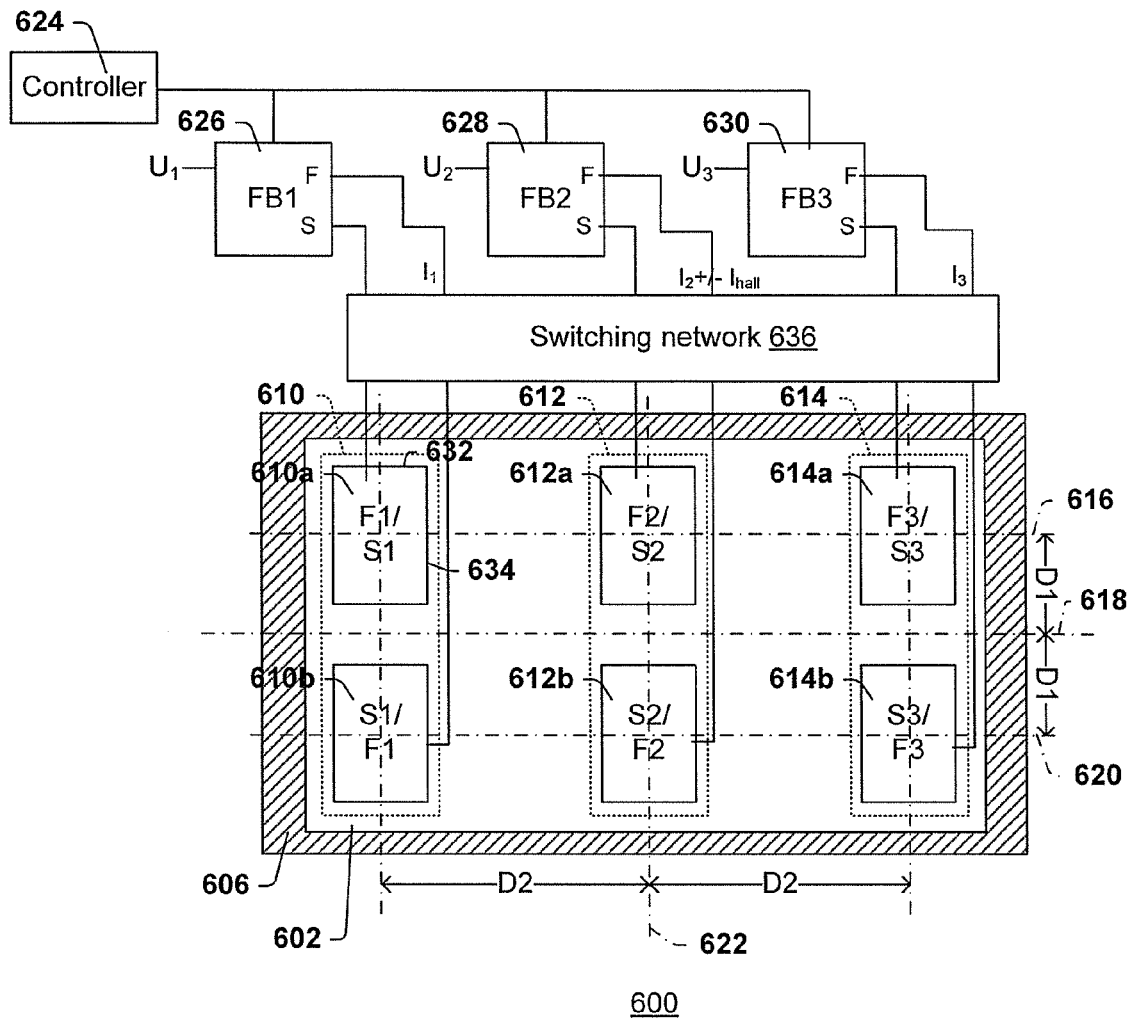
FIG. 6 illustrates a top view of a vertical Hall-effect device in accordance with some embodiments.

FIG. 6 shows an example of a vertical Hall-effect device 600 that makes use of "split" contacts in accordance with some embodiments. Within an n-type tub conductive tub 602 (which is surrounded by an isolation structure 606, such as a deep trench isolation region or a p-type region) three pairs of "split" contacts are arranged (e.g., first contact pair 610, second contact pair 612, third contact pair 614). Each contact pair includes a first contact (e.g., 610a, 612a, 614a) as well as a second contact (e.g., 610b, 612b, 614b). As will be appreciated in more detail below, feedback circuits 626, 628, 630 clamp the contact pairs to respective voltage potentials (e.g., U1, U2, U3) and measure a Hall-effect current from the biased device to accurately measure magnetic field.

Figure 14:
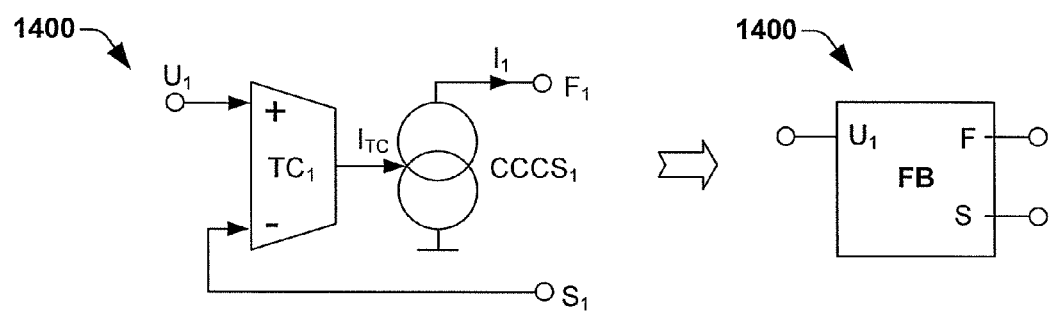
FIG. 14 shows a feedback circuit in accordance with some embodiments.

Before delving into the detailed functionality of vertical Hall-effect device 600, reference is made to FIG. 14, which illustrates an exemplary feedback circuit 1400 (e.g., feedback circuit 626 in FIG. 6). The feedback circuit 1400 comprises a transconductance input stage $TC_1$ and Current Controlled Current Source $CCCS_1$. The transconductance input stage $TC_1$ comprises a positive non-inverting input (+) and a negative inverting input (−). The transconductance input stage $TC_1$ is configured to output a current $I_{TC}$ that is proportional to the voltage between its non-inverting (+) and inverting (−) inputs. If the voltage at the non-inverting input is positive against the inverting input, the output current $I_{TC}$ is positive. If the voltage at the non-inverting input is negative against the inverting input, the output current $I_{TC}$ is negative.

The output current $I_{TC}$ of the transconductance stage $TC_1$ is provided to $CCCS_1$, which outputs a feedback current $I_1$ to a force contact $F_1$ to drive the voltage potential at an associated sense contact to the reference voltage potential $U_1$ (e.g., feedback current $I_1$ is provided to $F_1$ to drives the voltage potentials at $S_1$ to be equal to $U_1$). If $TC_1$ comprises a large factor of proportionality, a small voltage difference between the inverting inputs can provide a large output current to $CCCS_1$, since $I_1$ is proportional to current $I_{TC}$ and is independent of the contact resistance to which the current is supplied. In order to suppress the effect of contact resistances efficiently, the magnitude of current I1 must be much larger than the magnitude of the current flowing in or out of the inverting input of TC1. In an idealized case the inverting input draws no current at all.

Therefore, during operation, if the voltage potential at a sense contact (e.g., $S_1$) is lower than the reference or target voltage potential of the feedback circuit (e.g., $U_1$), the feedback circuit (e.g., $FB_1$) injects a large positive current (e.g., $I_1$) into a force contact (e.g., $F_1$) of the Hall-effect device to raise the potential at the sense contact (e.g., $S_1$) until it is equal to the reference voltage (e.g., $U_1$). Similarly, if the voltage potential at a sense contact (e.g., $S_1$) is higher than the reference or target voltage potential of the feedback circuit (e.g., $U_1$), the feedback circuit (e.g., $FB_1$) reduces its output current supplied to a force contact (e.g., $F_1$) of the Hall-effect device, thereby lowering the potential at the sense contact (e.g., $S_1$) until it is equal to the reference voltage (e.g., $U_1$).

Figure 7A:
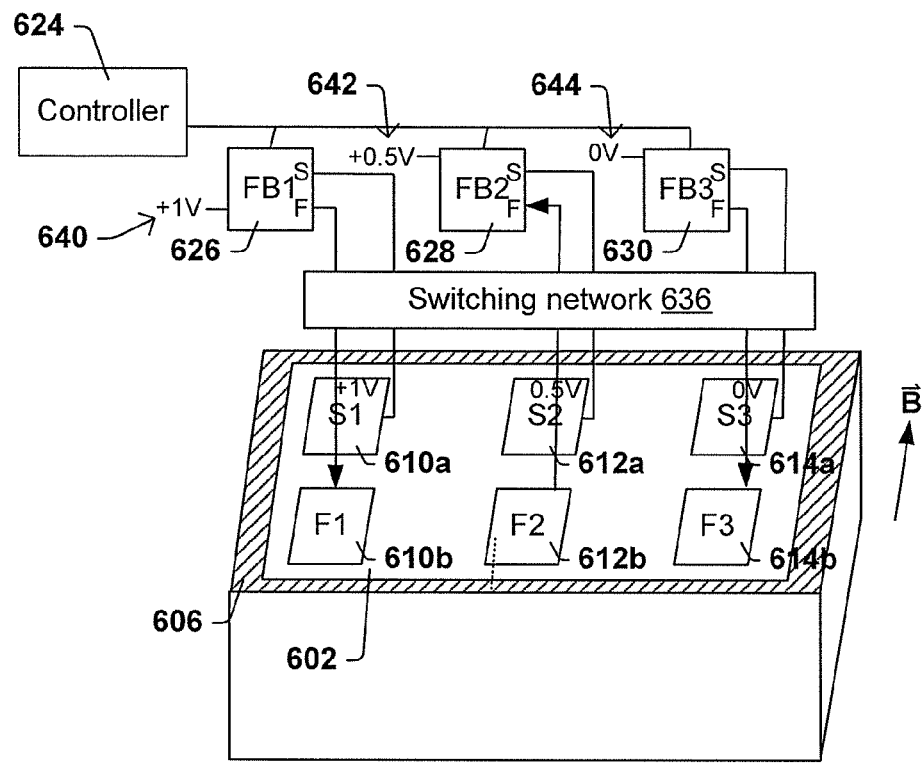
FIGS. 7A-7D illustrate a series of applied biases and measured currents for the vertical Hall-effect device of FIG. 6.

Referring now to FIGS. 7A-7D, one can see operation of the Hall-effect device 600. In FIG. 7A, at a first time, controller 624 sets switching network 636 to couple respective feedback circuits (626, 628, 630, respectively, having reference voltages +1V, +0.5V, and 0V, respectively) to contact pairs 610, 612, 614, respectively.

More particularly, in the illustrated example, the first feedback circuit 626 is coupled to first contact pair 610 for FIG. 7A. The first feedback circuit 626 changes the amount of current I1 delivered to force contact F1 until sense contact S1 measures a voltage of U1 (here 1V). In this way, first and second contacts 610a, 610b are clamped at 1V during first time in FIG. 7A. In this way, first contact 610a is clamped at 1V. Similarly, second contact 612a is clamped to 0.5V, and third contact 614a is clamped to 0V (612b will have a potential close to 0.5V, maybe slightly smaller or larger than 0.5V depending on its contact resistance and applied magnetic field, whereas 614b will have a potential slightly lower than 0V depending on its contact resistance). This voltage bias induces a current between force contact 610b and force contact 614b (due to V=IR), and magnetic field B drives the charged carriers of this induced current upward or downward with respect to the upper planar surface of substrate depending on the direction of the magnetic field B. Because the voltage potential on sense contact S2 (612a) is clamped at 0.5V and because feedback circuit FB2 does not allow current to be drawn into/from S2 (S2 is only used for voltage measurement), any Hall current $I_{hall}$ will be sunk into or injected from force contact F2 612b depending on the direction and magnitude of B. FB2 (or an ammeter elsewhere) can measure the Hall current injected into or sunk from F2 612b, and thereby determine the corresponding magnetic field.

Figure 7B:
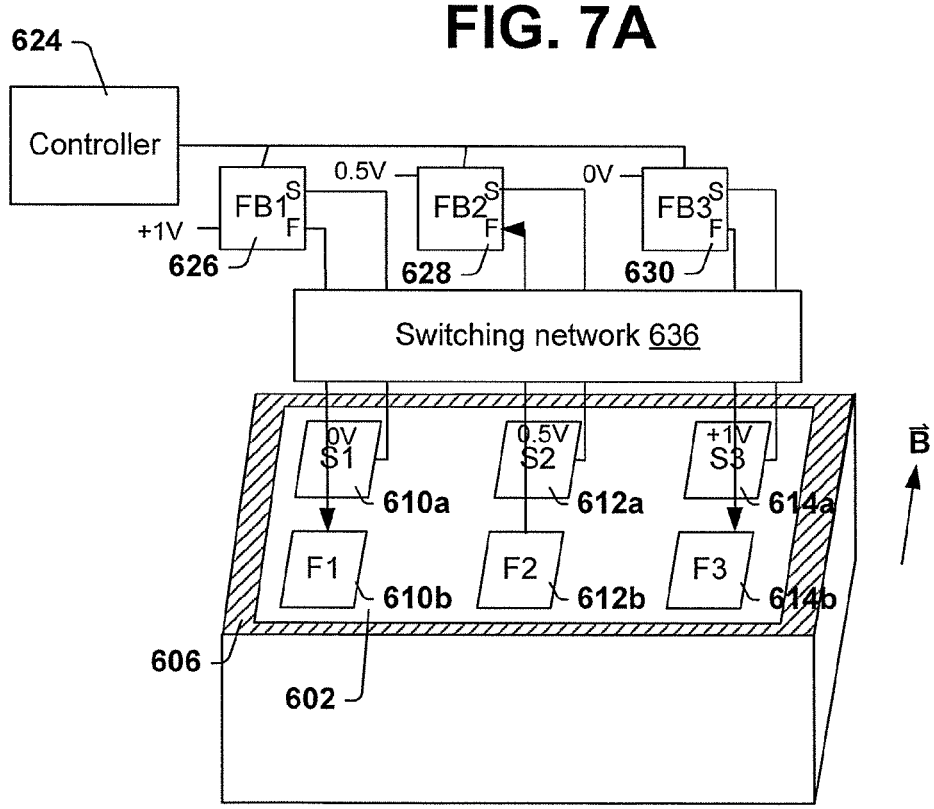

In FIG. 7B, at a second time, the controller 624 changes the state of the switching network 636 to "flip" the currents/voltages for the first and third contact pairs 610, 614 while leaving the second contact pair 612 clamped at 0.5V (e.g., FB1 626 is coupled to F3/S3 614 and FB3 630 is coupled to F1/S1 610). This "flip" causes a new current $I_{Hall}'$ to be sunk into or injected from F2. The new current $I_{Hall}'$ is again proportional to the magnetic field B, but will flow in the opposite direction of $I_{Hall}$ because of the switched voltage bias. If the device were perfectly symmetrical, the currents measured in FIGS. 7A and 7B would completely cancel one another, but in reality, FIG. 7B's Hall current $I_{Hall'}$ differs slightly from FIG. 7A's Hall current $I_{Hall}$ due to slight imperfections in the geometries of the device and other non-linearities. Assuming that magnetic field B is constant between FIG. 7A and FIG. 7B, taking the difference between $I_{Hall}$ (FIG. 7A) and $I_{HALL}'$ (FIG. 7B) provides a greatly reduced offset (as any errors between the two contacts, due to manufacturing imperfections and the like, tend to cancel each other). Thus, the magnetic field B is measured with greater precision.

Figure 7C:
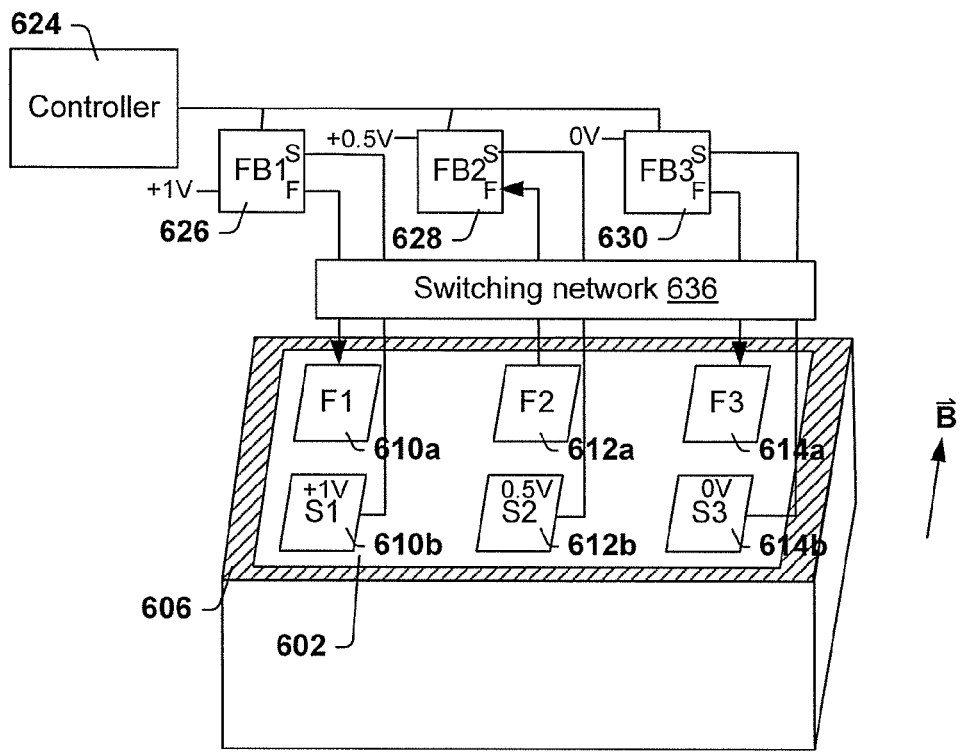
Figure 7D:
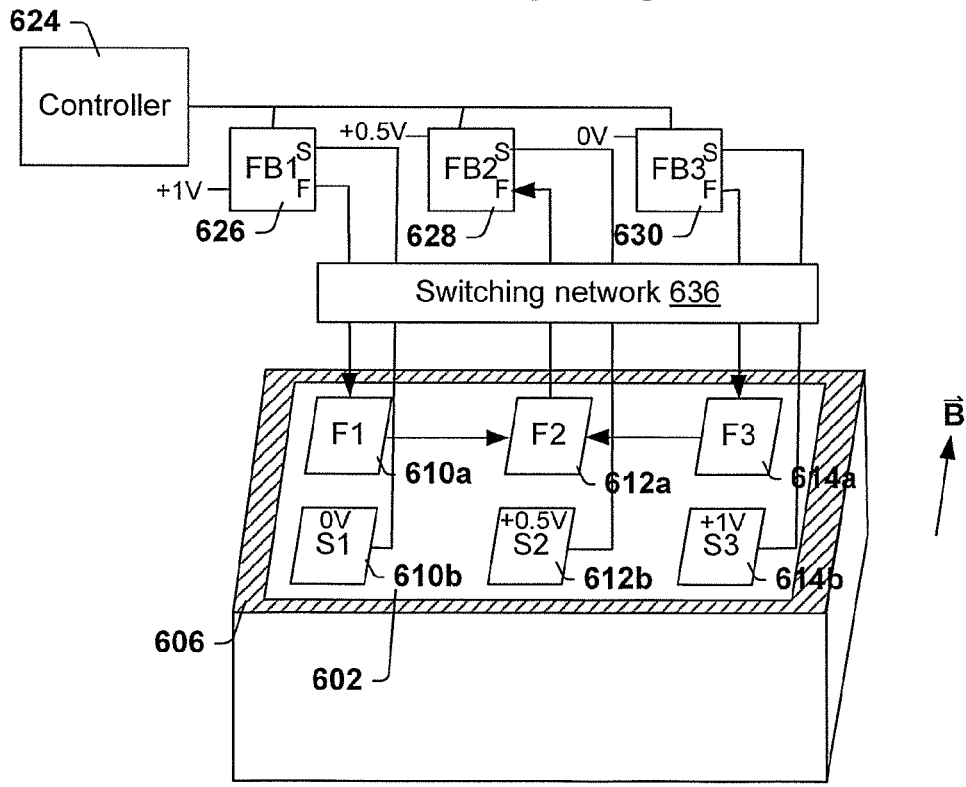

FIG. 7C shows the Hall sensor 600 at a third time, wherein the controller 624 has changed the state of the switching network 636 such that the force contacts and sense contacts have been "flipped". Thus, the upper row of contacts (e.g., first contacts 610a, 612a, 614a) now act as force contacts, and the lower row of contacts (e.g., second contacts 610b, 612b, 614b) now act as sense contacts. FIG. 7D shows the Hall sensors at a fourth time wherein the biases are flipped horizontally. Again, because the offsets inherent in these measured currents tend to cancel one another, by iteratively measuring the currents and subtracting them, the offset can be finely turned and the magnetic field can be measured with high accuracy.

It is also possible to start with a slight variation of FIG. 7A where only S2/F2 are flipped for a first clock phase, and in a second clock phase use a slight variation of FIG. 7B where S2/F2 are flipped. In general, the force/sense contacts can be changed in any permutation (e.g., checker board). While there are countless versions of these permutations, the important aspect is how to apply well defined potentials to the Hall region and how to extract output current from the Hall device, which is accomplishing using the "split" contacts and corresponding feedback circuits.

Note that in other (slightly more complicated) cases, the controller can apply Vin to S1 and concurrently drive S2 to ground. In the absence of magnetic field, the potential at S3 is no longer Vin/2, because S3 is not positioned halfway between the sense contacts S1, S2. The exact potential at S3 depends on the geometry (lateral and vertical) of the Hall-effect device features. The potential at S3 will be roughly at 0.3V for many kinds of devices, but can vary widely. To find the potential, it can be measured in an end-of-line test at zero B-field. Then the controller can be programmed to apply exactly this potential (e.g., 0.3V) to S3 during actual operation. Subsequently, during actual operation, a magnetic field would again like to raise or lower the voltage potential on sense contact S3. However, because S3 is clamped to 0.3V for example, a current will be injected to or sunk from S3 instead, wherein the amount of current provided is proportional to B-field.

Regardless of the particular biasing sequencing applied, the respective "first" and "second" contacts in contact pairs 610, 612, 614 are switched between acting as so-called "force contacts" (current flows through them) and so-called "sense contacts" (no current flows through them and they are used to measure the potential). Thus, the terms "force contact" and "sense contact" may be interchangeable in this respect, as currents and voltages may be measured and/or injected/applied from the various contacts depending on the time involved.

Referring back to FIG. 6, one will note that the first contacts 610a, 612a, 614a are arranged along a first line 616 extending in parallel with a first axis 618, while the second contacts 610b, 612b, 614b are arranged along a second line 620 extending in parallel with the first axis 618. The first and second lines 616, 620 are spaced equally apart from the first axis 618 by a distance D1, such that the respective first and second contacts are spaced symmetrically about opposite sides of the first axis 618. A second axis 622, which is perpendicular to the first axis 618, passes through second contact pair 612 such that the first and third contact pairs 610, 614 are spaced equally apart from the second axis 622 by distance D2.

In some embodiments, each first and second contact has outer dimensions that can range from approximately 0.2 um on a side to approximately 10 um on a side. Contacts can be square, rectangular, polygonal, or even rounded geometries; and multiple vias and/or multiple contact plugs can be coupled to each first or second contact (e.g., 610a). For example, for an illustrated rectangular contact 610a, a shorter side 632 could have a width of approximately 1 um to about 0.2 um, while a longer side 634 could have a length of approximately 3 um to approximately 10 um. The length and width can depend on the depth of the Hall region. For example, relatively shallow hall region of approximately 1 um might correspond to a length of approximately 3 um; while a deeper hall region of approximately 5 um might correspond to a width of approximately 10 um.

Figure 5:
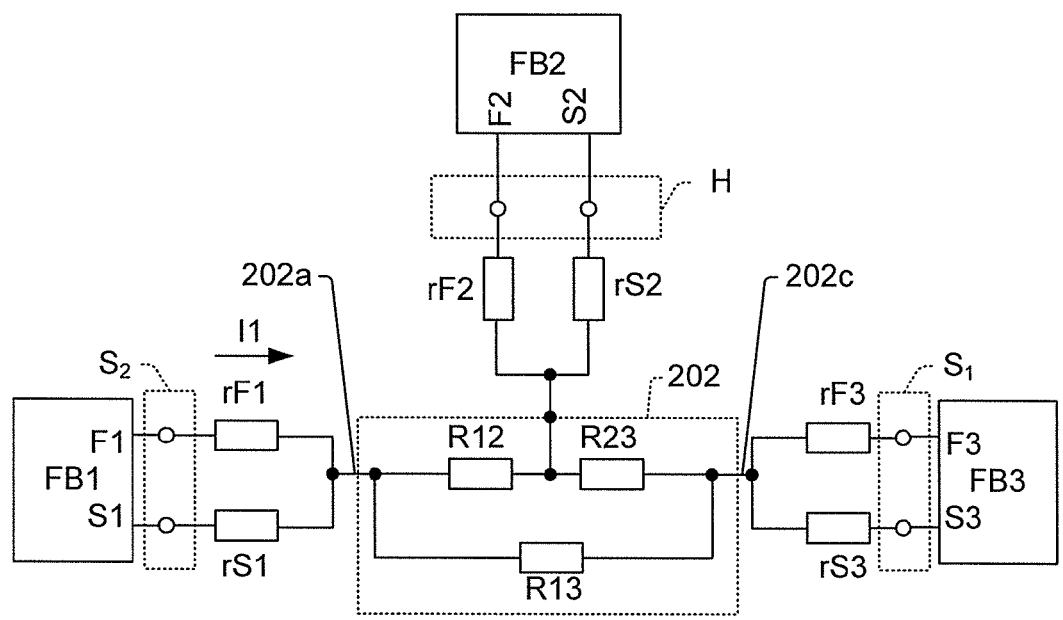
FIG. 5 illustrates an equivalent circuit for contact resistance of Hall-effect sensors in accordance with some embodiments.

FIG. 5 illustrates a schematic depiction of a vertical Hall-effect device 500 having "split contacts". Relative to FIG. 4's circuit diagram, each supply contact S1, S2 in FIG. 5's Hall-effect device has been split into two contacts—a force contact (F) and a sense contact (S). Similarly, the Hall-effect contact H has been split into a force contact (F) and a sense contact (S). Each force contact its own contact resistance (e.g., rF1) as does each sense contact (e.g., rS1), which are connected to a corresponding feedback circuit (e.g., FB1). During operation, the feedback circuit FB1 pushes current I1 into F1, causing a corresponding voltage drop over rF1. However, little or no current is drawn into port S1 of FB1, such that little or no voltage drop occurs over rS1. Therefore, the potential on S1 is an extremely accurate representation of the potential at terminal Hall region terminal 202a. Therefore, FB1 can adjust I1 until the potential at the Hall region 202 is exactly the one we want, namely Vin, which helps provide extremely accurate magnetic field measurements.

Figure 8:
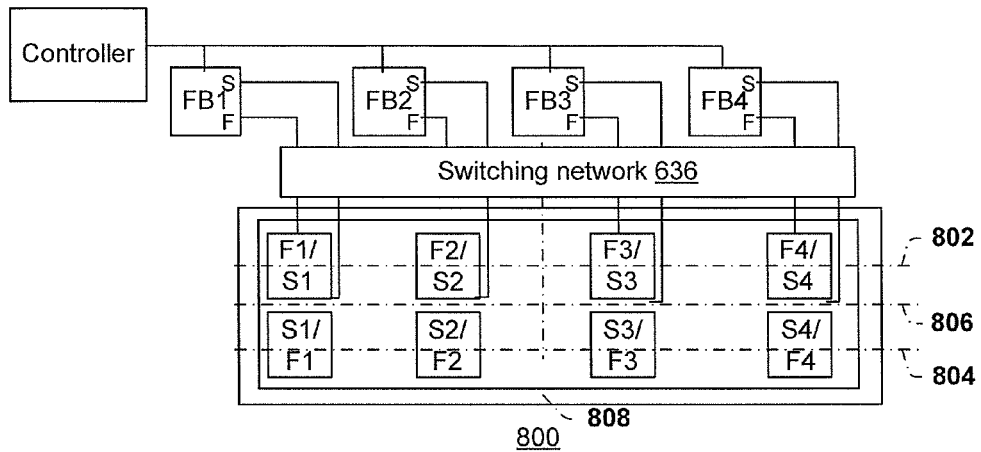
FIG. 8 illustrates a top view of a vertical Hall-effect device in accordance with some embodiments.
Figure 9A:
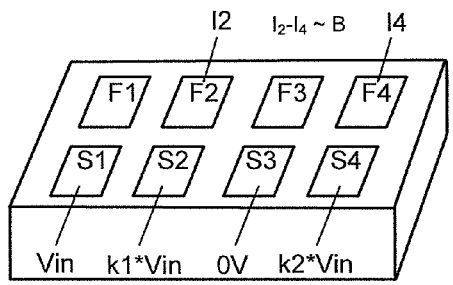
FIGS. 9A-9D illustrate a series of applied biases and measured currents for the vertical Hall-effect device of FIG. 8.
Figure 9B:
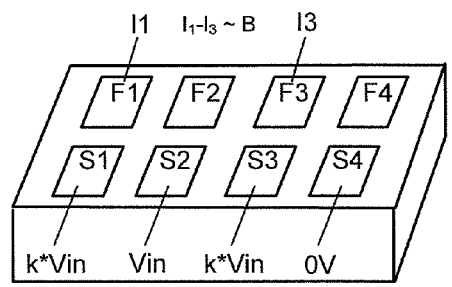
Figure 9C:
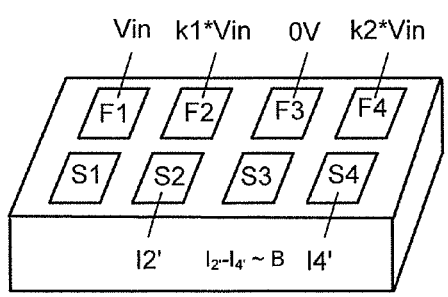
Figure 9D:
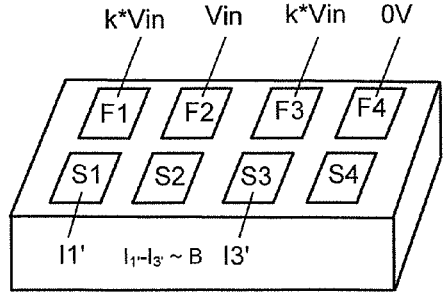

As can be appreciated from FIG. 8, the present disclosure is not limited to three contact pairs as previously discussed with regards to FIG. 6. Rather, the concept can be applied to any number of contact pairs. FIG. 8 shows one such example with four contact pairs, although additional contact pairs could also be used. The contacts of the contact pairs are again arranged on first and second lines 802, 804 that are spaced apart from a first axis 806, and are symmetrically arranged about a second axis 808 which is perpendicular to the first axis 806.

FIG. 9A-9D show one manner of successively applying biases (e.g., currents and voltages) to the contact pairs of FIG. 8 in a manner analogous to previously described FIGS. 7A-7D. In a first clock phase (FIG. 9A), respective feedback circuits (not shown) are coupled to contact pairs F1-S1, F2-S2, F3-S3, F4-S4, respectively, to establish potentials Vin, k1*Vin, 0V, and k2*Vin (with k1 preferable close to 0.5, yet it may range from 0.2 . . . 0.8; and k2 closer to 0V) on S1, S2, S3, S4, respectively. The difference of currents I2–I4 is proportional to the B-field.

In a second clock phase (FIG. 9B), the respective feedback circuits are coupled to contact pairs F1-S1, F2-S2, F3-S3, F4-S4, respectively to establish potentials k*Vin, Vin, k*Vin, and 0V (with k preferable close to 0.5, yet it may range from 0.2 . . . 0.8) on S1, S2, S3, S4, respectively. The difference of currents I1–I3 is proportional to the B-field. The combination I1–I3–(I2–I4) is proportional to B-field and has greatly suppressed offset error.

In a third clock phase (FIG. 9C) the measurement performed in the first clock phase is re-taken, albeit with the force-contacts and sense-contacts interchanged. The Hall signal is I2'–I4', which is proportional to magnetic field.

In a fourth clock phase (FIG. 9D) the measurement performed in the second clock phase is re-taken, albeit with the force-contacts and sense-contacts interchanged. The Hall signal is I1'–I3'. The combination [I1–I3–(I2–I4)]+[(I1'–I3')–(I2'–I4')] is proportional to B-field and shows even smaller offset error than above.

Figure 10:
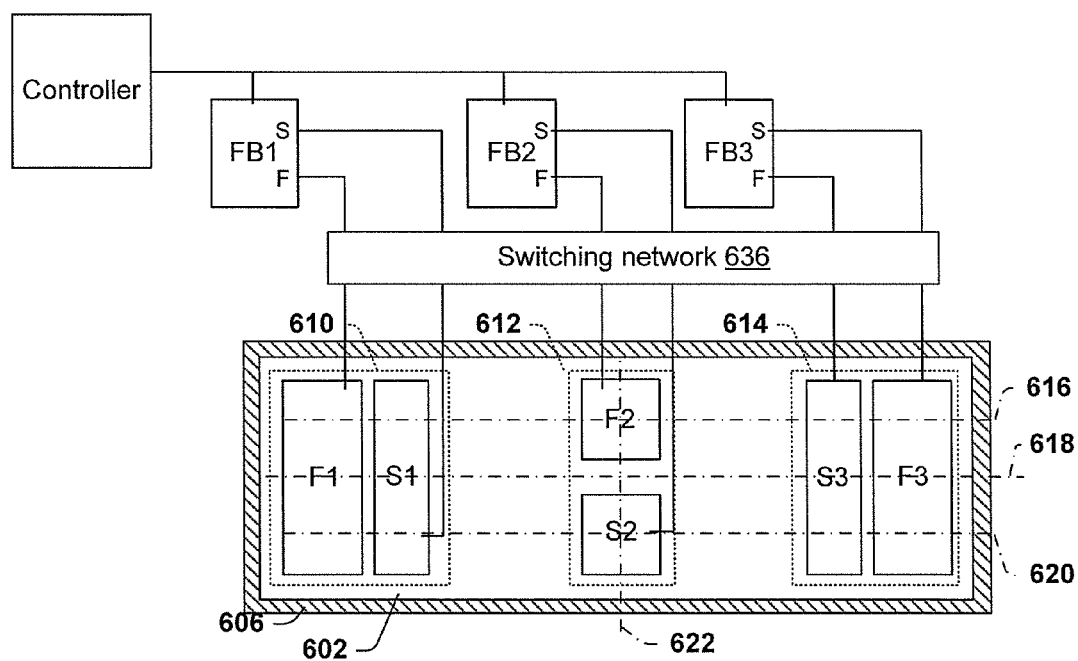
FIG. 10 illustrates a top view of another vertical Hall-effect device in accordance with some embodiments.

This spinning current scheme can be further improved by swapping the positive and negative supply terminals in all clock phases and repeating the measurements. For example, in a fifth clock phase (not shown), we can swap the supply terminals relative the illustrated first clock phase (FIG. 9B), such that the difference of currents I2"–I4" is proportional to the B-field. If we, in a sixth clock phase, swap the supply terminals relative to the second clock phase (FIG. 9B) the difference of currents I1"–I3" is proportional to the B-field. If, in a seventh clock phase, we swap the supply terminals relative to the third clock phase (FIG. 9C) the difference of currents I2'''–I4''' is proportional to the B-field. If, in an eighth clock phase, we swap the supply terminals relatively to the fourth clock phase (FIG. 9D) the difference of currents I1'''–I3''' is proportional to the B-field. Lastly, we compute I1–I2–I3+I4+I1'–I2'–I3'+I4'–(I1"–I2"–I3"+I4"'+I1'''–I2'''–I3'''+I4'''), which is proportional to B-field and shows even smaller offset error than above. Moreover, it is also possible to swap e.g. F2 with S2 and F4 with S4 in FIG. 9A: then not all force contacts are in a single row any more—only the force contacts of the supply terminals are in a row with the sense contacts of the Hall effect terminals (=signal terminals). In principle it is also possible to additionally swap F1 with S1: this gives an asymmetric arrangement of force and sense contacts that is likely not to provide very good residual offset, yet it may still give better results than prior art FIG. 10 shows another embodiment of a vertical hall Effect device 1000 where the contacts have a slightly different configuration. Like previous embodiments, the Hall-effect device 1000 includes a conductive tub 602 having a first conductivity type (e.g., n-type) disposed in a semiconductor substrate 604, and surrounded by isolation structure 606. The illustrated Hall-effect device 1000 again includes a three contact pairs 610, 612, 614. In this example, the first and third contact pairs 610, 614, however, are each split into two vertical contacts. The voltage biases applied to and currents measured from the various contacts can be flipped such that all contacts act as a force contact at one time and a sense contact at another time, as previously described in FIGS. 7A-7D. Although it is generally advantageous to have force and sense contacts of equal size, the force and sense contacts may also differ in size (e.g. the force contact may be larger to have a smaller voltage drop—there is no voltage drop along the sense path, because little or no current flows there), as shown by first contact pair 610 and third contact pair 614.

Figure 11:
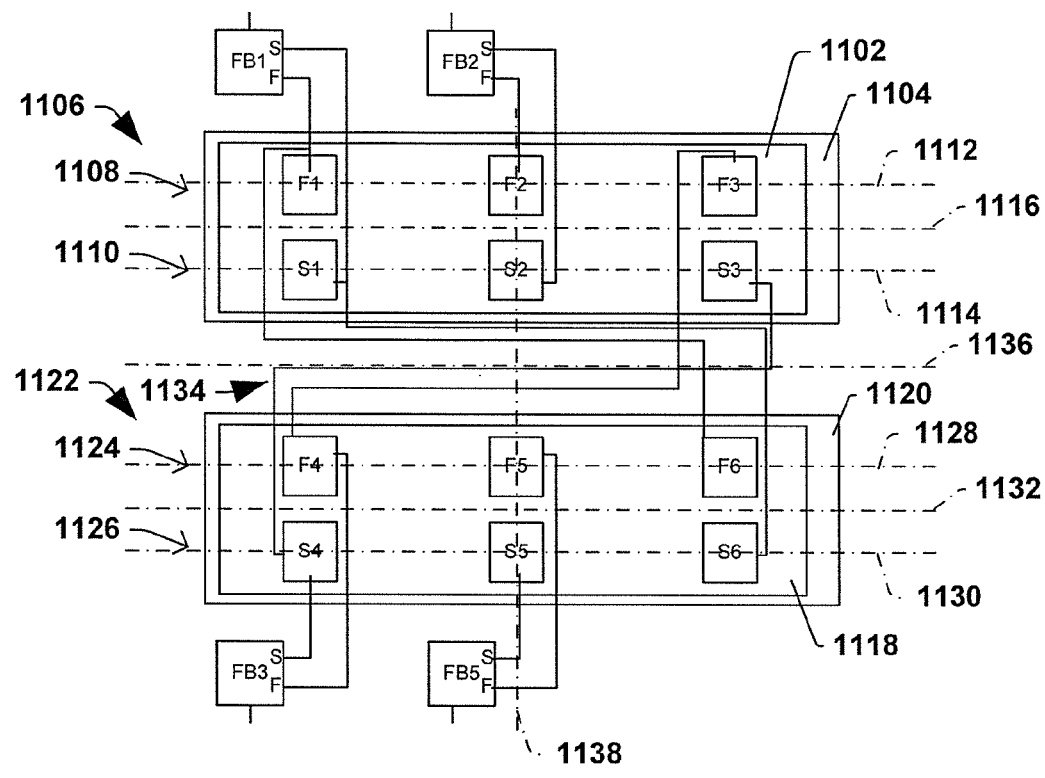
FIG. 11 illustrates an embodiment of a vertical Hall-effect device divided across two tubs, rather than a single tub.

FIG. 11 illustrates an embodiment of a vertical Hall-effect device 1100 that includes two tubs, rather than a single tub. The Hall-effect device includes a first tub 1102, which is surrounded by isolation structure 1104, and has a first conductivity type and is disposed in a semiconductor substrate. A first group of contact pairs 1106 having respective first and second contacts 1108, 1110 are disposed in the first tub 1102. First contacts 1108 are arranged along a first line 1112 and second contacts 1110 are arranged along a second line 1114, wherein the first and second lines 1112, 1114 run in parallel with a first tub axis 1116 arranged between the first and second lines 1112, 1114.

A second tub 1118, which is surrounded by isolation region 1120, has the first conductivity type and is disposed in the semiconductor substrate. A second group of contact pairs 1122, which include respective third and fourth contacts 1124, 1126, are disposed in the second tub 1118. The third contacts 1124 are arranged on a third line 1128 and fourth contacts 1126 are arranged on a fourth line 1130, wherein the third and fourth lines 1128, 1130 run in parallel with a second tub axis 1132 arranged between the third and fourth lines. The tubs are not necessarily parallel, but can also be orthogonal or at any angle.

An interconnect layer 1134 couples a first contact pair F1/S1 in the first tub 1104 with a second contact pair F6/S6 in the second tub 1118. The first and second contact pairs are spaced symmetrically about an axis 1136 passing between the first and second tubs. The first and second contact pairs are also spaced symmetrically with respect to a second axis that is perpendicular to the axis passing between the first and second tubs. For example, the interconnect structure couples F1 to F6 and S1 to S6, all of which are driven by FB1. The interconnect structure also couples F3 to F4 and S3 to S4, all of which are driven by FB2. Alternatively one may swap S4 with F4 and/or S5 with S5 and/or S6 with F6. This gives a large number of possible configurations whereof the preferred ones are those with higher degree of geometrical, thermal, electrical, and/or magnetic symmetry and/or symmetry with respect to mechanical stress on the devices.

Figure 12A:
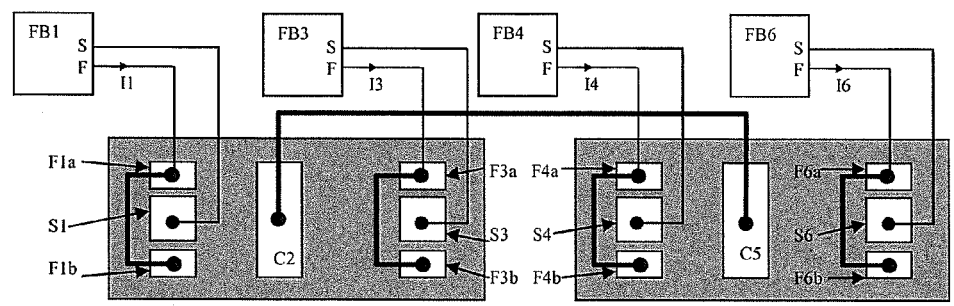
FIGS. 12A-12B illustrate another embodiment of a vertical Hall-effect device divided across two tubs.
Figure 12B:
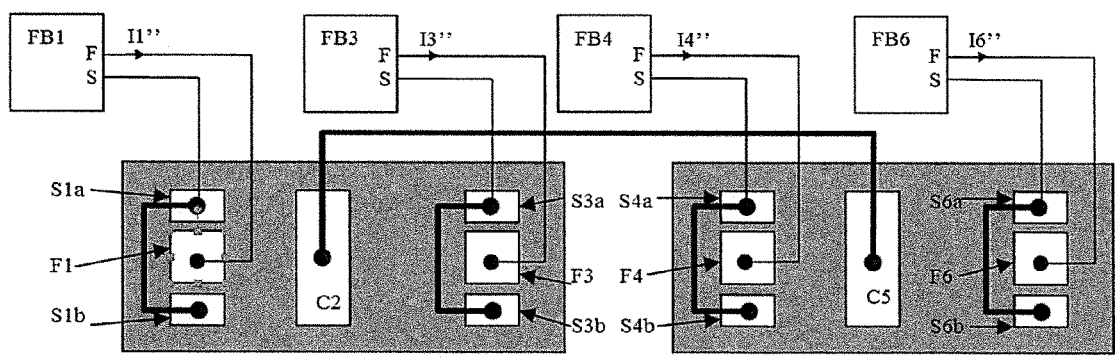

Another Hall-effect sensor is illustrated in FIG. 12A-12B, wherein the Hall-effect sensor 1200 is divided across two tubs. Hall-effect sensor 1200 consists of two separate Hall regions, each one with three contacts, where the center contacts of both tubs (C2, C5) are shorted. One of the other two contacts is used as a supply terminal and the other as a Hall-effect signal terminal.

As shown in FIG. 12A in a 1$^{st}$ clock phase, a positive supply voltage is applied to S1, and negative supply voltage is applied to S4. S3 and S6 are clamped to intermediate potentials and the difference I3−I6 increases with increasing By-field.

Note that at vanishing magnetic field, I3−I6 is usually not equal to zero: this is the systematic raw offset of the device.

In a second clock phase, S3 is forced to the positive supply voltage and S6 to the negative one. Then S1 and S4 are forced to intermediate potentials: ideally S1 is forced to the same potential as S3 was forced in the 1$^{st}$ clock cycle and S6 is forced to the same potential as S4 was forced in the 1$^{st}$ clock cycle. The difference I4−I1 increases with increasing By-field, and its systematic raw offset is equal in magnitude and opposite in sign to the raw offset of clock phase 1.

A total signal I3−I6+I4−I1 has greatly reduced offset and large sensitivity to By-field.

Another two clock cycles #3 and #4 may be added, where the roles of positive and negative supply voltages are exchanged: this changes the sign of the respective signals I3'−I6' and I4'−I1' so that they have to be subtracted from I3−I6+I4−I1−(I3'−I6'+I4'−I1'). This gives in total 4 clock phases.

Another 4 clock phases #5, #6, #7, #8 may be added, where the roles of force and sense contacts are exchanged, as shown in FIG. 12B.

In the clock phase #5 positive supply voltage is established on S1a, S1b and negative supply voltage on S4a, S4b and intermediate voltages are established on S3a, S3b and S6a, S6b. Then the current difference I3"−I6" is measured.

In the clock phase #6 positive supply voltage is established on S3a, S3b and negative supply voltage on S6a, S6b and intermediate voltages are established on S1a, S1b and S4a, S4b. Then the current difference I4"−I1" is measured.

In the clock phase #7 positive supply voltage is established on S4a, S4b and negative supply voltage on S1a, S1b and intermediate voltages are established on S3a, S3b and S6a, S6b. Then the current difference I6'''−I3''' is measured.

In the clock phase #8 positive supply voltage is established on S6a, S6b and negative supply voltage on S3a, S3b and intermediate voltages are established on S1a, S1b and S4a, S4b. Then the current difference I1'''−I4''' is measured.

The overall signal is computed: I3−I6+I4−I1−(I3'−I6'+I4'−I1')+I3"−I6"+I4"−I1"−(I3'''−I6'''+I4'''−I1'''). It has very small residual offset error and strong sensitivity to magnetic field.

A drawback of the device is the large raw offset due to the systematic difference in potentials of both Hall-effect terminals in both tubs.

Figure 13:
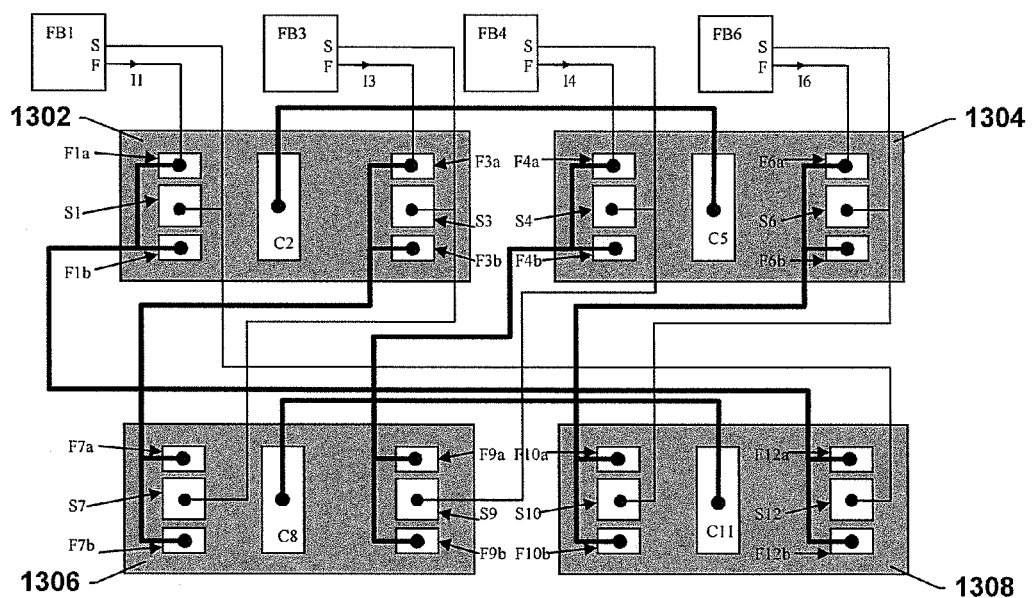
FIG. 13 illustrates another embodiment of a vertical Hall-effect device divided across two tubs.

To reduce this large raw offset the tubs and contacts can be arranged more symmetrically as shown in FIG. 13. FIG. 13 illustrates an embodiment of a vertical Hall-effect device divided across four tubs 1302, 1304, 1306, 1308. The wiring of individual contacts is such that two sense contacts (e.g. S3 and S7) and multiple force contacts (F3a, F3b, F7a, F7b) are coupled to each feedback circuit (e.g., FB3). For the sense contacts coupled to a given feedback circuit (e.g., which can be accomplished via a switching network (not shown)), one of them is placed in a tub with positive supply terminal (e.g. S3 if F1 is the positive supply) and the other one is placed in a tub with negative supply terminal (e.g. S7 if F9 is the negative supply). If these two sense contacts are shorted (i.e. their respective force-contacts F3a, F3b, F7a, F7b are shorted and also their respective sense contacts S3, S7 are shorted) a large difference current flows across these shorts in the absence of magnetic fields: this current corresponds to the raw offset of devices. This short pulls down the potential in S3 and up in S7 so that finally they are both at half of the supply voltage of the vertical Hall device. Then the feedback circuit FB3 only has to supply a small current I3 to the force contacts F3a, F3b, F7a, F7b to account for statistical offset (=mismatch between the devices) and to the applied By-field.

Note that the above figure is a circuit diagram where only each tub with its contacts corresponds to the layout—it does not say anything about the orientation of the four tubs in the layout. In a real layout the four tubs may be aligned in a row on a single horizontal line, they may be aligned in a column on a single vertical line, or they may be aligned in a quadrangle (e.g., 2×2 matrix).

Note that in FIG. 13 we may also skip two tubs in order to simplify the device. FIG. 11 illustrated one such example. In this instance, the potentials are forced in such a way that the current flow in both tubs is in opposite directions: In the 1$^{st}$ clock phase FB1 forces S1=S6=+1V and S3=S4=0V and S2=S5=0.5V. Then the difference in currents I2−I5 is proportional to the magnetic field. In a 2$^{nd}$ clock phase FB1 still forces S1=S6=+1V, yet this time FB3 forces 0.5V (or some value between 0.2V and 0.7V) on S3 and S4 and FB2 and FB5 force S2=S5=0V. Then the difference in currents goes toward zero.

Figure 15:
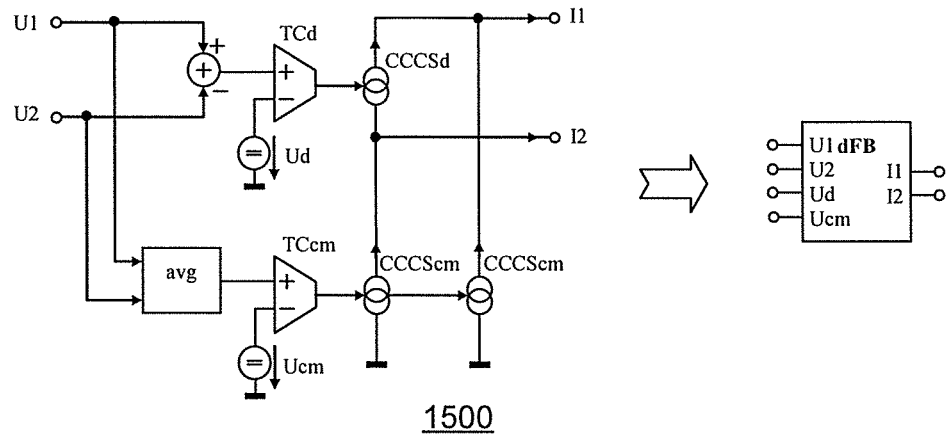
FIG. 15 shows a differential feedback circuit in accordance with some embodiments.

In some embodiments, a differential feedback circuit can be used, such as shown in FIG. 15. Differential feedback circuit 1500 has two voltage inputs U1, U2 and two current outputs I1, I2 and two reference voltages Ud, Ucm and it controls I1 and I2 in such a way that U1−U2=Ud and (U1+U2)/2=Ucm. The control loop might look like this, however, there are many modifications possible. The circuit subtracts U1−U2. A transconductance amplifier TCd with high open loop gain compares this value with Ud. If U1−U2>Ud then TCd outputs a large current into the current controlled current source CCCSd, which also outputs a large current (symbolized by the arrow at the upper end of the CCCSd symbol). The circuit also computes the average of U1 and U2 (=(U1+U2)/2) and TCcm compares it with Ucm. If (U1+U2)/2>Ucm then TCcm outputs a large current into both current controlled current sources CCCSm, which output a large current. The wiring ensures that I1=I(CCCScm)+I(CCCSd) and I2=I(CCCScm)−I(CCCSd). As shortcut: if Ud=0V or Ucm=0V we simply skip it in the symbol.

Figure 16A:
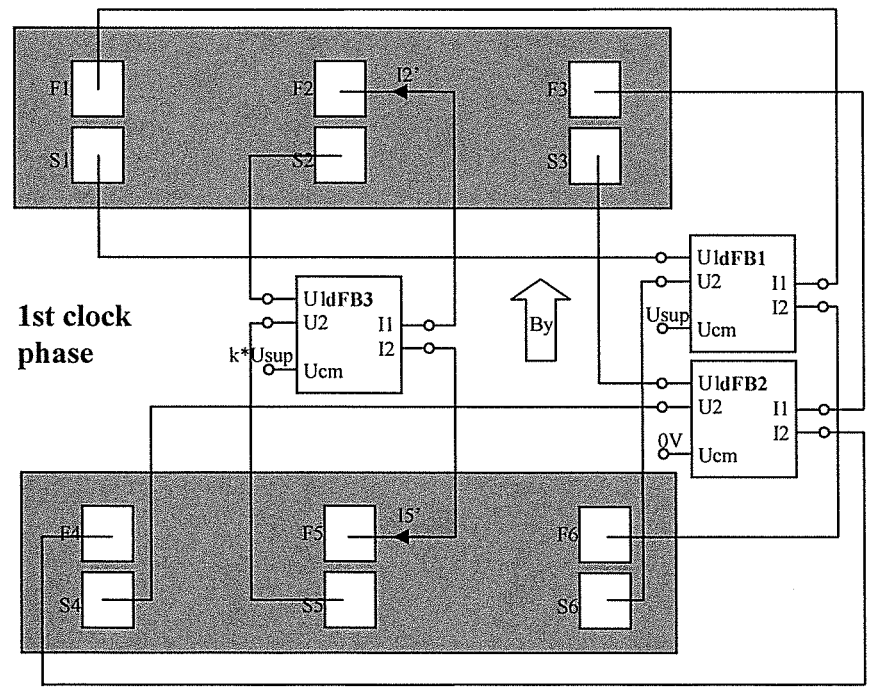
FIGS. 16A-16C show a vertical Hall-effect device that makes use of FIG. 15's differential feedback circuit.
Figure 16B:
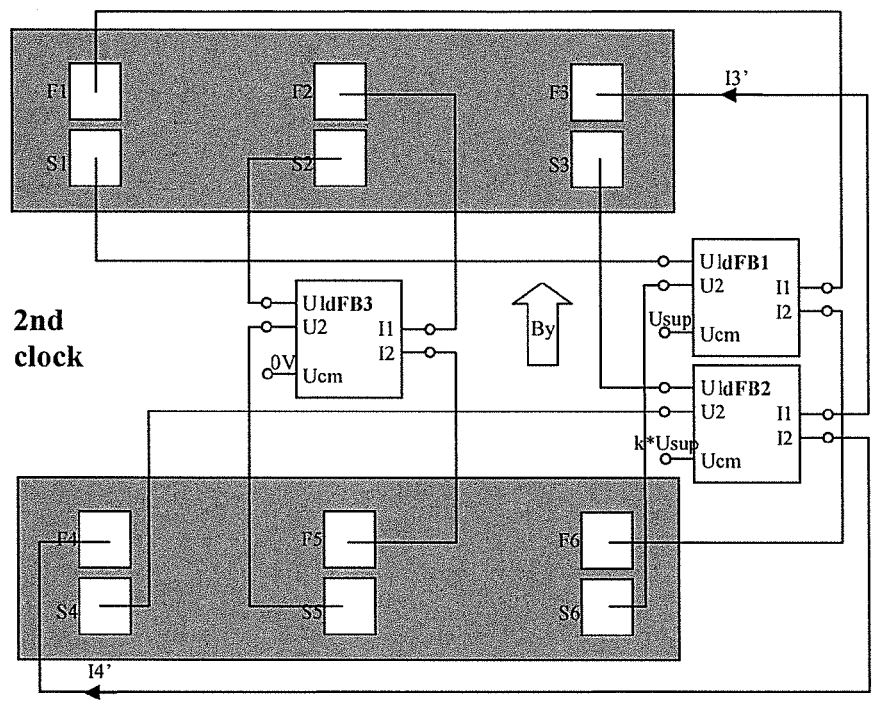
Figure 16C:
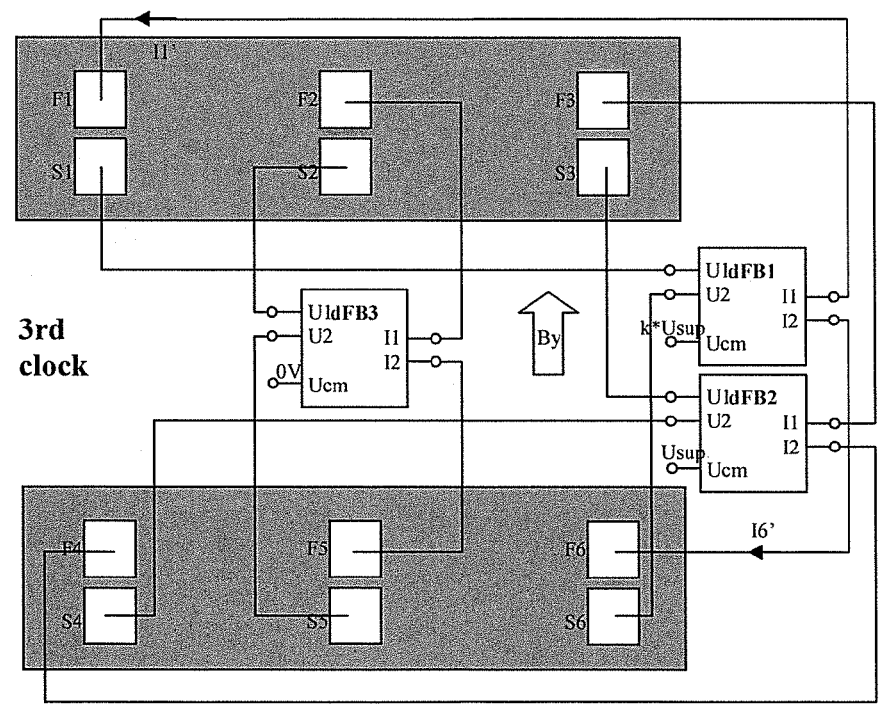

FIGS. 16A-16C show one example of how the differential feedback circuit 1500 can be used. In a 1$^{st}$ clock phase illustrated in FIG. 16A, dFB1 forces the potential Usup on S1 and S6 and dFB2 forces 0V (=ground) on S3 and S4. dFB3 forces k*Usup on S2 and S5, with k=0 . . . 1 (preferably 0.5). The current flows in the upper device from F1 to F3 and in the lower device from F6 to F4. Thus the current passes underneath F2 and F5 in opposite directions. Therefore if F2 and F5 would be floating a By-field would cause the potential at F2 to decrease and the potential at F5 to increase. In the absence of magnetic fields the potentials at F2 and F5 would be at Usup/2, if the devices are symmetric. Usually they are not symmetric, because the thickness of the depletion layer at the boundary of the device depends on the reverse bias voltage, which is a function of the spatial coordinate. Therefore even in the case of vanishing fields and perfect geometric symmetry of all tubs the potential at F2 and F5 is not exactly 0.5*Usup but rather 0.4*Usup. This is why we may use the k-factor to account for this.

Note that instead of 0V (=ground) it may be advantageous to force a slightly higher potential (e.g. 0.2 . . . 0.5V) on S3, S4, because this requires even lower potential at F3, F4 and in most systems voltages below 0V are not available. If we denote the positive supply voltage by Vsupp and the negative one by Vsupn, then the Hall effect terminals should be forced at Vsupn+k*(Vsupp−Vsupn)/2: e.g. Vsupp=1V, Vsupn=0.25V, k=0.45. The output signal is I2'−I5'.

In the $2^{nd}$ clock phase (FIG. 16B) the only difference to the $1^{st}$ clock phase is that Ucm of dFB3 and dFB2 are swapped. The output signal is I3'−I4'.

In the $3^{rd}$ clock phase (FIG. 16C) the only difference to the $2^{nd}$ clock phase is that Ucm of dFB1 and dFB2 are swapped. The output signal is I1'−I6'. Note that in all 3 clock phases there is no systematic raw offset (which means that at zero magnetic field and if there is no statistic mismatch between the two Hall regions and its contacts the output signals vanish at each clock phase). Alternatively F2 and S2 can be swapped as well as F5 and S5.

Although several examples have been shown above where the feedback control circuits establish respective predetermined reference potentials (e.g., U1, U2, U3=1V, 0.5V, 0V, respectively in FIG. 7A), it will be appreciated that it is not necessary that the reference potential be predetermined. In other embodiments discussed below with regards to FIGS. 17-19, the reference potential can correspond to a dynamic potential on a sense contact, for example.

Figure 17:
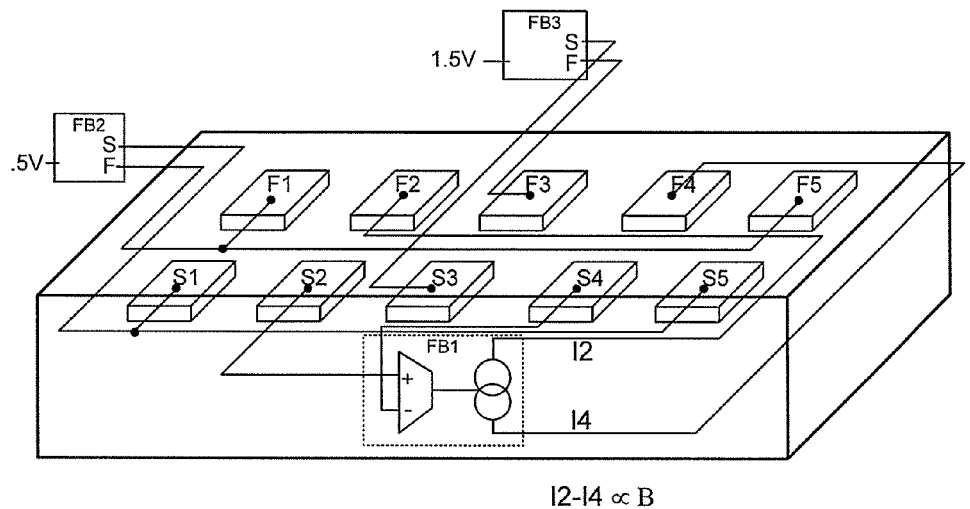
FIG. 17 shows another embodiment of a vertical Hall effect device.

FIG. 17 shows a 5-contact device including force and sense contacts in accordance with some embodiments. A lower row of sense contacts S1, S2, S3, S4, S5, and an upper row of force contacts F1, F2, F3, F4, F5 are shown. For purposes of simplicity a switching network is not shown, although the force contacts and sense contacts can be swapped, for example as described in previous embodiments. Feedback circuits FB2 and FB3 are the same as in FIG. 14, and the feedback circuit FB1 is the same, except the lower current terminal is now connected to F4 rather than ground.

In this arrangement, S3 is clamped to a predetermined reference potential of +1.5V; while S1 and S5 are clamped to a predetermined reference potential of +0.5V, such that current flows into F3. Approximately half of the current into F3 flows from F3 in an arc shape below F2 into F1; while the other half of the current into F3 flows from F3 below F4 to F5. Rather than feedback circuit FB1 forcing a common mode potential at S2 and S4, feedback circuit FB1 forces the difference in potentials S2−S4 to be zero (or some other predetermined value). Hence, unlike previous embodiments, the feedback circuit FB1 works differentially between contacts 2 and 4. That is, FB1 senses the potential difference between S2 and S4 and injects a current into F2 while extracting the same current out of F4 so that S2−S4 is zero volts (or some other predetermined value). The current may also have opposite sign so that current is extracted out of F2 and injected into F4, depending on the process deviations and magnetic field applied. Because sense contacts S2 and S4 (rather than predetermined reference voltages from dedicated reference circuits) are used to provide reference potentials to FB1, it will be appreciated that feedback circuits can use dynamic reference potentials rather than predetermined potentials.

Figure 18:
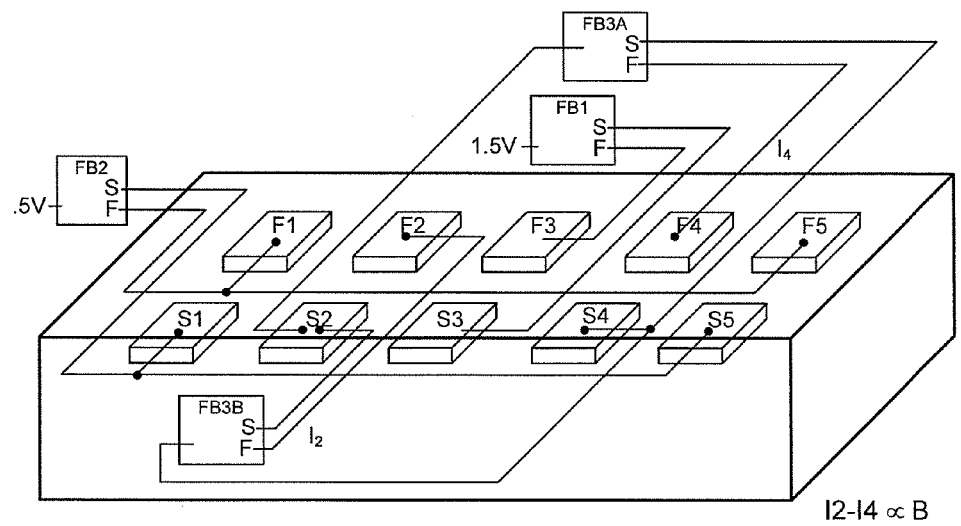
FIG. 18 shows another embodiment of a vertical Hall effect device.

In FIG. 18, feedback circuits FB3A and FB3B force the voltage between S2 and S4 to zero. FB3A, FB3B each sense the voltage between S2 and S4—but only block FB3A forces current to or from F4 (but not into or from F2) and only block FB3B forces current into or from F2 (but not into or from F4). Notably, the reference potential of FB3A is the potential measured at S2, which is not predetermined and which can vary dynamically. Thus, rather than the reference voltage used for the feedback circuits being a predetermined reference voltage supplied by a dedicated reference circuit (e.g., a band-gap reference circuit or voltage divider) providing U1 to FB1 in FIG. 6, the reference potential may also be supplied by the Hall device itself (e.g., from a sense contact).

Figure 19:
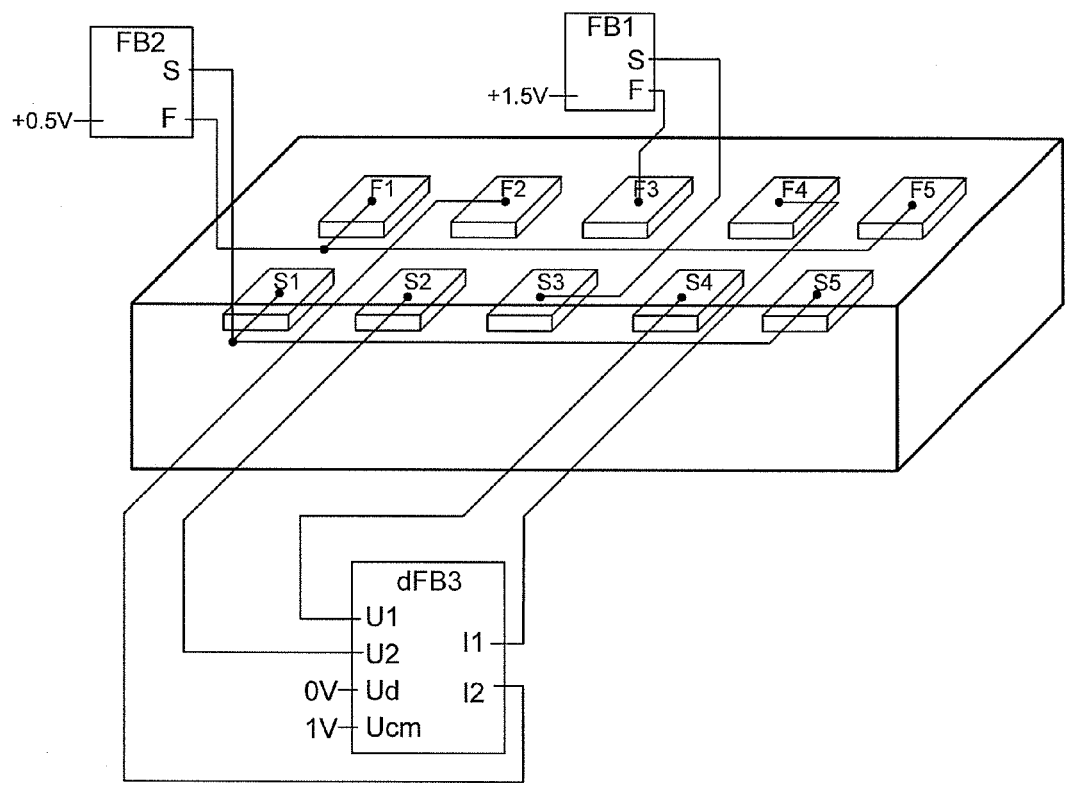
FIG. 19 shows another embodiment of a vertical Hall effect device.

In FIG. 19, FB1 clamps the sense contact S3 to predetermined potential of 1.5V and FB2 clamps S1 and S5 to 0.5V. A differential feedback circuit dFB3 is used to force S2−S4 to a predetermined differential potential $U_d$ of zero volts and to force (S2+S4)/2 to a predetermined common mode potential $U_{CM}$ of +1V. ((S2+S4)/2 is the common mode potential of S2, S4). Thus, FIG. 19's circuit forces not only the difference but also the common mode, whereas FIGS. 17-18 force only the difference voltage. Another aspect of FIG. 19 is that it shows how to use differential feedback circuits with a Hall device that has only a single tub. In comparison, FIGS. 16A-16C disclosed how to use differential feedback circuits with two-tub devices.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A vertical Hall-effect sensor system disposed on a semiconductor substrate, comprising:
    a first conductive Hall-effect region arranged beneath a surface of the semiconductor substrate;
    at least two supply terminals arranged to supply electrical energy to the first Hall-effect region;
    at least one Hall signal terminal arranged to provide a first Hall signal from the first Hall-effect region, the first Hall signal being indicative of a magnetic field which is parallel to the surface of the semiconductor substrate and which acts on the first Hall-effect region;
    wherein one or more of the at least two supply terminals or one or more of the at least one Hall signal terminal comprises a force contact and a sense contact; and
    a feedback control circuit comprising:
        an output connected to the force contact and having a first impedance,
        an input connected to the sense contact and having a second impedance, the second impedance being higher than the first impedance, and
        a feedback loop to adjust a potential on the output of the feedback control circuit until a potential on the input of the feedback control circuit is equal to a reference potential.

2. The vertical Hall-effect sensor of claim 1, wherein the reference potential is a predetermined reference potential.

3. The vertical Hall-effect sensor of claim 1, wherein the reference potential corresponds to a potential measured on a sense contact.

4. The vertical Hall-effect sensor of claim 1, wherein the at least two supply terminals and the at least one Hall signal terminal comprise respective force contacts and respective sense contacts.

5. The vertical Hall-effect sensor of claim 4, wherein the feedback circuit concurrently applies different reference potentials to the respective force contacts while using the respective sense contacts to monitor the respective potentials applied to the respective force contacts.

6. The vertical Hall-effect sensor of claim 1, wherein respective supply terminals and respective Hall signal terminals comprise respective force contacts and respective sense contacts, and wherein the feedback circuit concurrently applies at least three different reference potentials to the respective sense contacts.

7. The vertical Hall-effect sensor of claim 1, where the first Hall signal is derived from current flowing to or from the force contact.

8. The vertical Hall-effect sensor of claim 1, where the vertical Hall-effect sensor is operated in a spinning current scheme that repetitively swaps supply and Hall signal terminals during operation.

9. The vertical Hall-effect sensor of claim 1, further comprising:
- a second conductive Hall-effect region arranged beneath the semiconductor substrate surface and separated from the first conductive Hall effect region by an isolation structure;
- at least two supply terminals arranged to supply electrical energy to the second Hall-effect region;
- at least one Hall signal terminal arranged to provide a second Hall signal from the second Hall-effect region, the second Hall signal being indicative of the magnetic field acting on the second Hall-effect region; and
- wherein a magnetic field value is derived by taking a difference between the first and second Hall signals.

\* \* \* \* \*